(12) United States Patent
Paul et al.

(10) Patent No.: US 8,187,696 B2
(45) Date of Patent: *May 29, 2012

(54) CIRCUIT MATERIALS, CIRCUITS LAMINATES, AND METHOD OF MANUFACTURE THEREOF

(75) Inventors: Sankar K. Paul, Bradford, CT (US); Christopher J. Caisse, Danielson, CT (US); Dirk M. Baars, South Windsor, CT (US); Allen F. Horn, III, Pomfret Center, CT (US)

(73) Assignee: World Properties, Inc., Lincolnwood, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/504,996

(22) Filed: Jul. 17, 2009

(65) Prior Publication Data

US 2010/0015404 A1  Jan. 21, 2010

Related U.S. Application Data

(60) Provisional application No. 61/081,906, filed on Jul. 18, 2008.

(51) Int. Cl.
*B32B 15/00* (2006.01)

(52) U.S. Cl. ............ 428/209; 428/320.2; 428/323; 428/325; 428/327; 174/148; 174/149 R; 174/250; 174/258; 427/213.34; 156/275.5; 156/308.2; 156/309.6

(58) Field of Classification Search .......... 428/209, 428/320.1, 320.2, 325, 323, 327; 174/250–255, 174/258, 148, 149 R; 427/213.34; 156/275.5, 156/308.2, 309.6
See application file for complete search history.

(56) References Cited

U.S. PATENT DOCUMENTS

| | | | |
|---|---|---|---|
| 4,134,848 A | 1/1979 | Adicoff et al. | |
| 4,610,495 A | 9/1986 | Landi | |
| 4,661,301 A | 4/1987 | Okada et al. | |
| 4,994,316 A | 2/1991 | Browne et al. | |
| 5,126,192 A | 6/1992 | Chellis et al. | |
| 5,552,210 A * | 9/1996 | Horn et al. | 428/209 |
| 5,670,250 A * | 9/1997 | Sanville et al. | 428/323 |
| 5,888,627 A * | 3/1999 | Nakatani | 428/209 |
| 5,972,811 A * | 10/1999 | St. Lawrence et al. | 442/237 |
| 6,528,145 B1 * | 3/2003 | Berger et al. | 428/156 |

FOREIGN PATENT DOCUMENTS

| | | |
|---|---|---|
| EP | 0440918 A2 | 8/1991 |
| WO | 2010009381 A1 | 1/2010 |

OTHER PUBLICATIONS

PCT/US2009/050968; World Properties, Inc. "International Preliminary Report on Patentability" (Form PCT/ISA/237) "Written Opinion" issued on Jan. 18, 2011.
PCT/US2009/050968; World Properties, Inc. "International Search Report" (Form PCT/ISA/220/210) issued on Dec. 4, 2009.

\* cited by examiner

*Primary Examiner* — Cathy Lam
(74) *Attorney, Agent, or Firm* — Cantor Colburn LLP

(57) ABSTRACT

A circuit substrate laminate, comprising a conductive metal layer; and a dielectric composite material having a dielectric constant of less than about 3.5 and a dissipation factor of less than about 0.006, wherein the dielectric composite material comprises: a polymer resin; and about 10 to about 70 volume percent of cenospheres having a ferric oxide content of less than or equal to 3 weight percent.

24 Claims, 1 Drawing Sheet

CIRCUIT MATERIALS, CIRCUITS LAMINATES, AND METHOD OF MANUFACTURE THEREOF

CROSS-REFERENCE TO RELATED APPLICATIONS

This application claims the benefit of U.S. Provisional Application Ser. No. 61/081,906 filed Jul. 18, 2008, which is incorporated herein by reference in its entirety.

BACKGROUND

This invention generally relates to circuit materials, methods for the manufacture of the circuit materials, and articles formed therefrom, including circuits and circuit laminates.

As used herein, a circuit material is an article used in the manufacture of circuits and multi-layer circuits, and includes circuit subassemblies, bond plies, resin coated conductive layers, unclad dielectric layers, and cover films. A circuit laminate is a type of circuit subassembly that has a conductive layer, e.g., copper, fixedly attached to a dielectric layer. Double clad circuit laminates have two conductive layers, one on each side of the dielectric layer. Patterning a conductive layer of a laminate, for example by etching, provides a circuit. Multilayer circuits comprise a plurality of conductive layers, at least one of which contains a conductive wiring pattern. Typically, multilayer circuits are formed by laminating one or more circuits together using bond plies, by building up additional layers with resin coated conductive layers that are subsequently etched, or by building up additional layers by adding unclad dielectric layers followed by additive metallization. After forming the multilayer circuit, known hole-forming and plating technologies can be used to produce useful electrical pathways between conductive layers.

Mineral and ceramic particulate fillers are widely used to control the dielectric and physical properties of polymeric dielectric composite materials used in dielectric layers. Particularly where a low dielectric constant is desired, hollow glass or ceramic microspheres can be used. For example, in U.S. Pat. No. 4,134,848, Adicoff et al. describe a composite for a stripline board material having hollow, air-filled glass microspheres in a hydrocarbon matrix. Okada and Fujino, in U.S. Pat. No. 4,661,301, teach the production of a hollow glass microsphere-filled polymer composite made by directly extruding the molten composition into the opening of a vertical double belt press. In U.S. Pat. No. 5,126,192, Chellis et al. disclose a filled prepreg material having a dielectric constant below 3.2, made with very small experimental hollow microspheres from 3M, and hollow glass microspheres from Grace Syntactic of Canton, Mass. U.S. Pat. No. 4,610,495 to Landi discloses the use of a layer of elastomer filled with hollow spheres for controlling impedance in a solderless connector for a microelectronic device. U.S. Pat. No. 4,994,316 to Browne and Jarvis disclose a bonding layer for circuit boards containing hollow glass microspheres.

The manufacture of small glass or ceramic microspheres (diameters=1 to 1000 micrometers) is costly, and therefore results in significantly more expensive circuit materials. While the synthetic microspheres described above are used for purposes of improving electrical properties in dielectric circuit substrates, there remains a need in the art for low dielectric constant, low loss circuit materials that are suitable for use in demanding applications such as high frequency applications.

SUMMARY OF INVENTION

The above-described drawbacks and disadvantages are alleviated by a circuit subassembly comprising a conductive layer disposed on a dielectric substrate layer, wherein the dielectric layer comprises, based on the volume of the dielectric layer, about 30 to about 90 volume percent of a polymer matrix, and about 10 to about 70 volume percent of filler component comprising a plurality of cenospheres having a ferric oxide content of about 3 weight percent or less based on the weight of the cenospheres; wherein the circuit laminate has a dielectric constant of less than about 3.5 and a dissipation factor of less than about 0.006.

A method of manufacture of the dielectric composite material is described, comprising combining the polymer matrix material and the cenosphere filler.

Also described are circuit materials, circuit subassemblies, circuits, and multilayer circuits comprising the dielectric composition, and their methods of manufacture.

The invention is further illustrated by the following drawings, detailed description, and examples.

BRIEF DESCRIPTION OF DRAWINGS

Referring now to the exemplary drawings wherein like elements are numbered alike in the figure.

DETAILED DESCRIPTION

Figure 1:
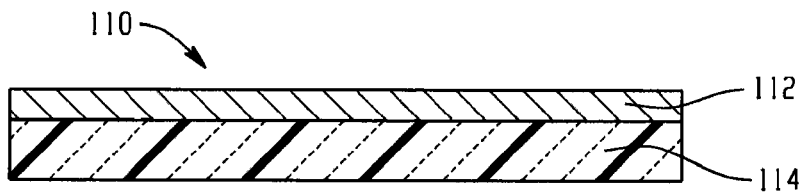
FIG. 1 is a schematic of a single clad laminate.

It has been unexpectedly discovered by the inventors hereof that use of cenospheres having a ferric oxide content of less than 3 wt % as a particulate filler in dielectric composite material allows the manufacture of high frequency circuit substrates of lower dielectric constant and dissipation factor. Circuits and multilayer circuits based on the dielectric composite material have properties equal to or superior to those made with more costly synthetic glass hollow microspheres of the prior art.

Cenospheres are hollow, alumino-silicate microspheres that are a byproduct of coal combustion. The hollow microspheres are collected by flotation of fly ash from power plants and purified and classified into controlled particle size distributions. Commercially available cenospheres include FIL-LITE® 106 and FILLIITE® 160W from Trelleborg Fillite Ltd.; BIONIC BUBBLE™ XL-150 and VEA X-10 from Sphere Services, Inc.; and E-SPHERES® from Envirospheres Pty. Ltd. of Lindfield, Australia; among others. The compositions of these cenospheres are listed in Table 1, showing weight percent ranges of the major components for the various cenosphere products.

TABLE 1

| Cenosphere | $Al_2O_3$ | $SiO_2$ | $Fe_2O_3$ |
| --- | --- | --- | --- |
| FILLITE ® 106 | 27-33 | 55-65 | 6.0 max. |
| FILLITE ® 160W | 34-39 | 55-65 | 2.0 max |
| E-SPHERES SL-75 | 36-40 | 55-60 | 0.5 max |
| XL-150 | 30-35 | 45-50 | 3.0 max |
| VEA X-10 | 74.9 | 12.3 | 1.3 |

As seen in Table 1, aluminum oxide and silicon oxide are the major components of the cenospheres, with ferric oxide making up a smaller portion. As will be described in greater detail in the Examples below, it was unexpectedly found that acceptable high frequency properties could be obtained by controlling the amount of ferric oxide in the cenospheres used in the dielectric composite material. Specifically, a ferric oxide content of less than about 3 wt % of the weight of the cenospheres results in a dielectric material having the desired electrical properties, particularly for high frequency circuit applications. Use of cenospheres having less than 3 wt % of ferric oxide provides a dielectric material having a low dielectric constant and a dissipation factor of less than about 0.006, specifically less than or equal to about 0.0055, and more specifically less than or equal to about 0.005. In one embodiment, the dielectric material has a dissipation factor of less than about 0.004. In another embodiment, the dielectric material has a dissipation factor of less than about 0.003. In still another embodiment, the dielectric material has a dissipation factor of less than about 0.0025.

The size and the size distribution of the filler particles can vary, depending on the desired characteristics of the dielectric composite material. In an exemplary embodiment, the cenospheres of the particulate filler exhibit a median particle diameter of about 20 to about 500 micrometers, specifically about 20 to about 100 micrometers. The size distribution can be bimodal, trimodal, or the like.

The cenospheres are present in the dielectric composite material in an amount effective to lower the dissipation factor and the dielectric constant of the composition to the desired level, in particular, a level suitable for high frequency circuit substrate applications. In some cases, it is desirable to fine-tune the dielectric constant of a high frequency circuit substrate to a predetermined value, while maintaining a high overall volume loading of filler to achieve a low coefficient of thermal expansion. In such cases, the desired effect may be obtained by loading levels of the cenospheres as low as about 10 volume percent. In one embodiment, the cenospheres are present in the dielectric composite material in an amount of about 10 to about 70 volume percent (vol. %), based on the total volume of the composition, specifically about 15 to about 65 vol. %, and more specifically about 20 to about 60 vol. %. In a specific embodiment, the cenospheres are present in the dielectric composite material in an amount of about 20 to about 70 vol. %.

The dielectric composite material can optionally include an additional particulate filler other than the cenospheres. Use of additional types of fillers allows the dielectric constant, dissipation factor, coefficient of thermal expansion, and other properties of the dielectric composite material to be fine-tuned. Examples of secondary particulate fillers include, without limitation, titanium dioxide (rutile and anatase), barium titanate, strontium titanate, silica (including fused amorphous silica), corundum, wollastonite, $Ba_2Ti_9O_{20}$, solid glass spheres, synthetic glass or ceramic hollow spheres, quartz, boron nitride, aluminum nitride, silicon carbide, beryllia, alumina, alumina trihydrate, magnesia, mica, talcs, nanoclays, and magnesium hydroxide. A combination comprising one or more secondary fillers can be used. The fillers can be surface treated with an organofunctional alkoxy silane, zirconate, or titanate coupling agent to improve the dispersion of the filler in the polymeric matrix and reduce water absorption of the finished composite circuit substrate.

The filler component used to manufacture the dielectric composite material can accordingly comprise from 1 to 99 vol. % of the cenospheres and from 1 to 99 vol. % of a secondary filler, specifically from 10 to 90 vol. % of the cenospheres and from 10 to 90 vol. % of the secondary filler, more specifically from 25 to 75 vol. % of the cenospheres and 25 to 75 vol. % of the secondary filler. In one embodiment, the filler component comprises 30 to 50 vol. % of the cenospheres and 70 to 50 vol. % of fused amorphous silica as a secondary filler.

The cenospheres are dispersed in a dielectric polymer matrix material to form the dielectric composite material. Exemplary dielectric polymer matrix materials include low polarity, low dielectric constant and low loss polymer resins, including those based on thermosetting and thermoplastic resins such as 1,2-polybutadiene (PBD), polyisoprene, polybutadiene-polyisoprene copolymers, polyetherimide (PEI), fluoropolymers such as polytetrafluoroethylene (PTFE), polyimide, polyetheretherketone (PEEK), polyamidimide, polyethylene terephthalate (PET), polyethylene naphthalate, polycyclohexylene terephthalate, polybutadiene-polyisoprene copolymers, polyphenylene ether resins, and those based on allylated polyphenylene ether resins. These materials exhibit the desirable features of low dielectric constant that can be further improved (i.e., reduced) by addition of the cenospheres. Combinations of low polarity resins with higher polarity resins can also be used, non-limiting examples including epoxy and poly(phenylene ether), epoxy and poly(ether imide), cyanate ester and poly(phenylene ether), and 1,2-polybutadiene and polyethylene.

Suitable fluoropolymer matrix materials for the dielectric layer include fluorinated homopolymers, e.g., polytetrafluoroethylene (PTFE) and polychlorotrifluoroethylene (PCTFE), and fluorinated copolymers, e.g. copolymers of tetrafluoroethylene with a monomer selected from the group consisting of hexafluoropropylene and perfluoroalkylvinylethers, copolymers of tetrafluoroethylene with a monomer selected from the group consisting of vinylidene fluoride, vinyl fluoride and ethylene, and copolymers of chlorotrifluoroethylene with a monomer selected from the group of hexafluoropropylene, perfluoroalkylvinylethers, vinylidene fluoride, vinyl fluoride and ethylene. Blends of these fluoropolymers and terpolymers formed from the above listed monomers can also be used as the polymer matrix material.

Other specific polymer matrix materials include thermosetting polybutadiene and/or polyisoprene resin. As used herein, the term "thermosetting polybutadiene and/or polyisoprene resin" includes homopolymers and copolymers comprising units derived from butadiene, isoprene, or mixtures thereof. Units derived from other copolymerizable monomers can also be present in the resin, for example in the form of grafts. Exemplary copolymerizable monomers include, but are not limited to, vinylaromatic monomers, for example substituted and unsubstituted monovinylaromatic monomers such as styrene, 3-methylstyrene, 3,5-diethylstyrene, 4-n-propylstyrene, alpha-methylstyrene, alpha-methyl vinyltoluene, para-hydroxystyrene, para-methoxystyrene, alpha-chlorostyrene, alpha-bromostyrene, dichlorostyrene, dibromostyrene, tetra-chlorostyrene, and the like; and substituted and unsubstituted divinylaromatic monomers such as divinylbenzene, divinyltoluene, and the like. Combinations comprising at least one of the foregoing copolymerizable monomers can also be used. Exemplary thermosetting polybutadiene and/or polyisoprene resins include, but are not limited to, butadiene homopolymers, isoprene homopolymers, butadiene-vinylaromatic copolymers such as butadiene-styrene, isoprene-vinylaromatic copolymers such as isoprene-styrene copolymers, and the like.

The thermosetting polybutadiene and/or polyisoprene resins can also be modified, for example the resins can be hydroxyl-terminated, methacrylate-terminated, carboxylate-terminated resins. Post-reacted resins can be used, such as such as epoxy-, maleic anhydride-, or urethane-modified butadiene or isoprene resins. The resins can also be crosslinked, for example by divinylaromatic compounds such as divinyl benzene, e.g., a polybutadiene-styrene crosslinked with divinyl benzene. Exemplary resins are broadly classified as "polybutadienes" by their manufacturers, for example Nippon Soda Co., Tokyo, Japan, and Sartomer Company Inc., Exton, Pa. Mixtures of resins can also be used, for example, a mixture of a polybutadiene homopolymer and a poly(butadiene-isoprene) copolymer. Combinations comprising a syndiotactic polybutadiene can also be useful.

The thermosetting polybutadiene and/or polyisoprene resin can be liquid or solid at room temperature. Suitable liquid resins can have a number average molecular weight greater than about 5,000 but generally have a number average molecular weight of less than about 5,000 (most preferably about 1,000 to about 3,000). Thermosetting polybutadiene and/or polyisoprene resins having at least 90 wt. % 1,2 addition are preferred because they exhibit the greatest crosslink density upon cure, due to the large number of pendent vinyl groups available for crosslinking.

The polybutadiene and/or polyisoprene resin is present in the polymer matrix composition in an amount of up to 100 wt. %, specifically about 60 wt. % with respect to the total resin system, more specifically about 10 to about 55 wt. %, even more specifically about 15 to about 45 wt. %, based on the total polymer matrix composition.

Other polymers that can co-cure with the thermosetting polybutadiene and/or polyisoprene resins can be added for specific property or processing modifications. For example, in order to improve the stability of the dielectric strength and mechanical properties of the electrical substrate material over time, a lower molecular weight ethylene propylene elastomer can be used in the resin systems. An ethylene propylene elastomer as used herein is a copolymer, terpolymer, or other polymer comprising primarily ethylene and propylene. Ethylene propylene elastomers can be further classified as EPM copolymers (i.e., copolymers of ethylene and propylene monomers) or EPDM terpolymers (i.e., terpolymers of ethylene, propylene, and diene monomers). Ethylene propylene diene terpolymer rubbers, in particular, have saturated main chains, with unsaturation available off the main chain for facile cross-linking. Liquid ethylene propylene diene terpolymer rubbers, in which the diene is dicyclopentadiene, are preferred.

Useful molecular weights of the ethylene propylene rubbers are less than 10,000 viscosity average molecular weight. Suitable ethylene propylene rubbers include an ethylene propylene rubber having a viscosity average molecular weight (MV) of about 7,200, which is available from Uniroyal Chemical Co., Middlebury, Conn., under the trade name Trilene CP80; a liquid ethylene propylene dicyclopentadiene terpolymer rubbers having a molecular weight of about 7,000, which is available from Uniroyal Chemical Co. under the trade name of Trilene 65; and a liquid ethylene propylene ethylidene norbornene terpolymer, having a molecular weight of about 7,500, which is available from Uniroyal Chemical Co. under the name Trilene 67.

The ethylene propylene rubber is preferably present in an amount effective to maintain the stability of the properties of the substrate material over time, in particular the dielectric strength and mechanical properties. Typically, such amounts are up to about 20 wt. % with respect to the total weight of the polymer matrix composition, more specifically about 4 to about 20 wt. %, even more specifically about 6 to about 12 wt. %.

Another type of co-curable polymer is an unsaturated polybutadiene- or polyisoprene-containing elastomer. This component can be a random or block copolymer of primarily 1,3-addition butadiene or isoprene with an ethylenically unsaturated monomer, for example a vinylaromatic compound such as styrene or alpha-methyl styrene, an acrylate or methacrylate such a methyl methacrylate, or acrylonitrile. The elastomer is preferably a solid, thermoplastic elastomer comprising a linear or graft-type block copolymer having a polybutadiene or polyisoprene block, and a thermoplastic block that preferably is derived from a monovinylaromatic monomer such as styrene or alpha-methyl styrene. Suitable block copolymers of this type include styrene-butadiene-styrene triblock copolymers, for example those available from Dexco Polymers, Houston, Tex., under the trade name Vector 8508M, from Enichem Elastomers America, Houston, Tex., under the trade name Sol-T-6302, and those from Fina Oil and Chemical Company, Dallas, Tex., under the trade name Finaprene 401; styrene-butadiene diblock copolymers; and mixed triblock and diblock copolymers containing styrene and butadiene, for example those available from Shell Chemical Corporation, Houston, Tex., under the trade name KRATON D1118. KRATON D1118 is a mixed diblock/triblock styrene and butadiene containing copolymer, containing 30 vol. % styrene.

The optional polybutadiene- or polyisoprene-containing elastomer can further comprise a second block copolymer similar to that described above, except that the polybutadiene or polyisoprene block is hydrogenated, thereby forming a polyethylene block (in the case of polybutadiene) or an ethylene-propylene copolymer block (in the case of polyisoprene). When used in conjunction with the above-described copolymer, materials with greater toughness can be produced. An exemplary second block copolymer of this type is KRATON GX1855 (commercially available from Shell Chemical Corp.), which is believed to be a mixture of a styrene-high 1,2-butadiene-styrene block copolymer and a styrene-(ethylene-propylene)-styrene block copolymer.

Typically, the unsaturated polybutadiene- or polyisoprene-containing elastomer component is present in the resin system in an amount of about 10 to about 60 wt. % with respect to the total polymer matrix composition, more specifically about 20 to about 50 wt. %, or even more specifically about 25 to about 40 wt. %.

Still other co-curable polymers that can be added for specific property or processing modifications include, but are not limited to, homopolymers or copolymers of ethylene such as polyethylene and ethylene oxide copolymers; natural rubber; norbornene polymers such as polydicyclopentadiene; hydrogenated styrene-isoprene-styrene copolymers and butadiene-acrylonitrile copolymers; unsaturated polyesters; and the like. Levels of these copolymers are generally less than 50 wt. % of the total polymer matrix composition system.

Free radical-curable monomers can also be added for specific property or processing modifications, for example to increase the crosslink density of the resin system after cure. Exemplary monomers that can be suitable crosslinking agents include, for example, di, tri-, or higher ethylenically unsaturated monomers such as divinyl benzene, triallyl cyanurate, diallyl phthalate, and multifunctional acrylate monomers (e.g., Sartomer resins available from Arco Specialty Chemicals Co., Newtown Square, Pa.), or combinations thereof, all of which are commercially available. The crosslinking agent, when used, is present in the resin system in an amount of up to about 20 wt. %, specifically 1 to 15 wt. %, based on the total polymer matrix composition.

A curing agent can be added to the resin system to accelerate the curing reaction of the polyenes having olefinic reactive sites. Specifically useful curing agents are organic peroxides such as, dicumyl peroxide, t-butyl perbenzoate, 2,5- dimethyl-2,5-di(t-butyl peroxy)hexane, α,α-di-bis(t-butyl peroxy)diisopropylbenzene, and 2,5-dimethyl-2,5-di(t-butyl peroxy)hexyne-3, all of which are commercially available. They can be used alone or in combination. Typical amounts of curing agent are from about 1.5 to about 10 wt. % of the total polymer matrix composition.

In another embodiment, the polymer matrix material comprises a poly(arylene ether); optionally, a polybutadiene or polyisoprene polymer, specifically a carboxylated polybutadiene or polyisoprene polymer; and optionally, an elastomeric block copolymer comprising units derived from an alkenyl aromatic compound and a conjugated diene. The poly(arylene ether) can also optionally be carboxy-functionalized.

The poly(arylene ether) can be in the form of a homopolymer or a copolymer, including a graft or a block copolymer. Combinations of various forms can be used. Poly(arylene ether)s comprise a plurality of structural units of formula (1):

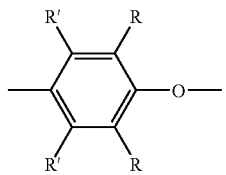

(1)

wherein for each structural unit, each R and R' is independently hydrogen, halogen, primary or secondary $C_{1-7}$ alkyl, phenyl, $C_{1-7}$ aminoalkyl, $C_{1-7}$ alkenylalkyl, $C_{1-7}$ alkynylalkyl, $C_{1-7}$ alkoxy, $C_{6-10}$ aryl, and $C_{6-10}$ aryloxy. In some embodiments, each R is independently $C_{1-7}$ alkyl or phenyl, for example, $C_{1-4}$ alkyl, and each R' is independently hydrogen or methyl.

Exemplary poly(arylene ether)s include poly(2,6-dimethyl-1,4-phenylene ether), poly(2,6-diethyl-1,4-phenylene ether), poly(2,6-dipropyl-1,4-phenylene ether), poly(2-methyl-6-allyl-1,4-phenylene ether), poly(di-tert-butyl-dimethoxy-1,4-phenylene ether), poly(2,6-dichloromethyl-1,4-phenylene ether), poly(2,6-dibromomethyl-1,4-phenylene ether), poly(2,6-di(2-chloroethyl)-1,4-phenylene ether), poly(2,6-ditolyl-1,4-phenylene ether), poly(2,6-dichloro-1,4-phenylene ether), poly(2,6-diphenyl-1,4-phenylene ether), and poly(2,5-dimethyl-1,4-phenylene ether). A useful poly(arylene ether) comprises 2,6-dimethyl-1,4-phenylene ether units, optionally in combination with 2,3,6-trimethyl-1,4-phenylene ether units.

The poly(arylene ether) can be functionalized so as to provide a functional group that enhances adhesion between a conductive metal layer and the dielectric layer. Functionalization can be accomplished using a polyfunctional compound having in the molecule both (i) a carbon-carbon double bond or a carbon-carbon triple bond, and (ii) one or more of a carboxy group, including a carboxylic acid, anhydride, amide, ester, or acid halide. In one embodiment the functional group is a carboxylic acid or ester group. Examples of polyfunctional compounds that can provide a carboxylic acid functional group include maleic acid, maleic anhydride, fumaric acid, and citric acid.

In particular, suitable functionalized poly(arylene ether)s include the reaction product of a poly(arylene ether) and a cyclic carboxylic acid anhydride. Examples of suitable cyclic anhydrides are maleic anhydride, succinic anhydride, glutaric anhydride, adipic anhydride, and phthalic anhydride, more specifically, maleic anhydride. Modified poly(arylene ethers) such as maleinized poly(arylene ethers) can be produced by methods as described in U.S. Pat. No. 5,310,820, or are commercially available. Examples of commercially available suitable modified and unmodified poly(arylene ethers) include PPE-MA from Asahi (a maleinized poly(arylene ether)), and Blendex HPP820 from Chemtura (an unmodified poly(arylene ether)).

In addition to an poly(arylene ether), the polymer matrix material can optionally further comprise a polybutadiene or polyisoprene polymer, which in this embodiment includes homopolymers derived from butadiene, homopolymers derived from isoprene, and copolymers derived from butadiene and/or isoprene and/or less than 50 weight percent (wt %) of a monomer co-curable with the butadiene and/or isoprene. Suitable monomers co-curable with butadiene and/or isoprene include monoethylenically unsaturated compounds such as acrylonitrile, ethacrylonitrile, methacrylonitrile, alpha-chloroacrylonitrile, beta-chloroacrylonitrile, alpha-bromoacrylonitrile, $C_{1-6}$ alkyl(meth)acrylates (for example, methyl(meth)acrylate, ethyl(meth)acrylate, n-butyl(meth)acrylate, n-propyl(meth)acrylate, and isopropyl(meth)acrylate), acrylamide, methacrylamide, maleimide, N-methyl maleimide, N-ethyl maleimide, itaconic acid, (meth)acrylic acid, alkenyl aromatic compounds as described below, and combinations comprising at least one of the foregoing monoethylenically unsaturated monomers.

In one embodiment, the polybutadiene or polyisoprene polymer is carboxy-functionalized. Functionalization can be accomplished using a polyfunctional compound having in the molecule both (i) a carbon-carbon double bond or a carbon-carbon triple bond, and (ii) one or more of a carboxy group, including a carboxylic acid, anhydride, amide, ester, or acid halide. A preferred carboxy group is a carboxylic acid or ester. Examples of polyfunctional compounds that can provide a carboxylic acid functional group include maleic acid, maleic anhydride, fumaric acid, and citric acid. In particular, polybutadienes adducted with maleic anhydride can be used in the thermosetting composition. Suitable maleinized polybutadiene polymers are commercially available, for example from Sartomer under the trade names RICON 130MA8, RICON 130MA13, RICON 130MA20, RICON 131MA5, RICON 131MA10, RICON 131MA17, RICON 131MA20, and RICON 156MA17. Suitable maleinized polybutadiene-styrene copolymers are commercially available, for example, from Sartomer under the trade names RICON 184MA6. RICON 184MA6 is a butadiene-styrene copolymer adducted with maleic anhydride having styrene content from 17 to 27 wt % and number average molecular weight (Mn) of about 9,900 g/mole.

In addition to an poly(arylene ether) and the polybutadiene or polyisoprene polymer, the polymer matrix material can optionally further comprise an elastomeric polymer. The elastomeric polymer of this embodiment include elastomeric block copolymers comprising a block (A) derived from an alkenyl aromatic compound and a block (B) derived from a conjugated diene. The arrangement of blocks (A) and (B) includes linear and graft structures, including radial teleblock structures having branched chains. Examples of linear structures include diblock (A-B), triblock (A-B-A or B-A-B), tetrablock (A-B-A-B), and pentablock (A-B-A-B-A or B-A-B-A-B) structures as well as linear structures containing 6 or more blocks in total of A and B. Specific block copolymers include diblock, triblock, and tetrablock structures, and specifically the A-B diblock and A-B-A triblock structures.

The alkenyl aromatic compound providing the block (A) is represented by formula (2):

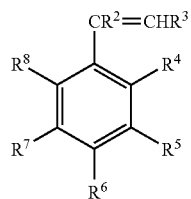

wherein each of $R^2$ and $R^3$ is independently hydrogen, $C_1$-$C_5$ alkyl, bromo, or chloro, and each of $R^4$, $R^5$, $R^6$, $R^7$, and $R^8$ is independently hydrogen, $C_1$-$C_{12}$ alkyl, $C_3$-$C_{12}$ cycloalkyl, $C_6$-$C_{12}$ aryl, $C_7$-$C_{12}$ aralkyl, $C_7$-$C_{12}$ alkaryl, $C_1$-$C_{12}$ alkoxy, $C_3$-$C_{12}$ cycloalkoxy, $C_6$-$C_{12}$ aryloxy, chloro, bromo, or hydroxy. Exemplary alkenyl aromatic compounds include styrene, 3-methylstyrene, 4-methylstyrene, 3,5-diethylstyrene, 4-n-propylstyrene, alpha-methylstyrene, alpha-methyl vinyltoluene, alpha-chlorostyrene, alpha-bromostyrene, dichlorostyrene, dibromostyrene, tetra-chlorostyrene, and the like, and combinations comprising at least one of the foregoing compounds. Styrene and/or alpha-methylstyrene are often used.

Specific examples of the conjugated dienes used to provide block (B) include 1,3-butadiene, 2-methyl-1,3-butadiene (isoprene), 2,3-dimethyl-1,3-butadiene, and 1,3-pentadiene, specifically 1,3-butadiene and isoprene. A combination of conjugated dienes can be used. The block (B) derived from a conjugated diene is optionally partially or fully hydrogenated.

Exemplary block copolymers comprising a block (A) derived from an alkenyl aromatic compound and block (B) derived from a conjugated diene include styrene-butadiene diblock copolymer (SB), styrene-butadiene-styrene triblock copolymer (SBS), styrene-isoprene diblock copolymer (SI), styrene-isoprene-styrene triblock copolymer (SIS), styrene-(ethylene-butylene)-styrene triblock copolymer (SEBS), styrene-(ethylene-propylene)-styrene triblock copolymer (SEPS), and styrene-(ethylene-butylene) diblock copolymer (SEB). Such polymers are commercially available, for example from Shell Chemical Corporation under the trade names KRATON D-1101, KRATON D-1102, KRATON D-1107, KRATON D-1111, KRATON D-1116, KRATON D-1117, KRATON D-1118, KRATON D-1119, KRATON D-1122, KRATON D-1135X, KRATON D-1184, KRATON D-1144X, KRATON D-1300X, KRATON D-4141, KRATON D-4158, KRATON G1726, and KRATON G-1652. KRATON D-1118 is a solid SB-SBS copolymer. This copolymer has polystyrene end blocks and a rubbery polybutadiene mid-block with about 20% SBS triblock and about 80% SB diblock. It is a low modulus, low cohesive strength, soft rubber.

In addition to the one or more of the polymers described above, the poly(arylene ether) matrix material can further optionally further comprise the additives described herein, for example cure initiators, crosslinking agents, viscosity modifiers, coupling agents, wetting agents, flame retardants, fillers, and antioxidants. The particular choice of additives depends upon the nature of the conductive metal layer and the desired properties of the product, such as dielectric constant, dissipation factor, water absorbance, flame retardance, and/or other desired properties.

The relative amount of the poly(arylene ether)s, the polybutadiene or polyisoprene polymer, and the elastomeric block copolymer will depend on the particular conductive metal layer used, the desired properties of the circuit materials and circuit laminates, and like considerations. It has been found that use of a poly(arylene ether) provides increased bond strength to the conductive metal layer, particularly copper. Use of a polybutadiene or polyisoprene polymer further increases high temperature resistance of the laminates, particularly when these polymers are carboxy-functionalized. Use of an elastomeric block copolymer may function to compatibilize the components of the polymer matrix material. Determination of the appropriate quantities of each component can be done without undue experimentation. In one embodiment, the polymer matrix material comprises up to 100 wt % of the poly(arylene) ether, specifically the carboxy-functionalized poly(arylene ether). In another embodiment, the thermosetting composition consists essentially of up to 100 wt % of the poly(arylene) ether, specifically the carboxy-functionalized poly(arylene) ether. The polymer matrix material can alternatively comprise about 20 to about 99 wt %, specifically about 30 to about 80 wt %, more specifically about 40 to about 60 wt % of the poly(arylene ether), preferably the carboxy-functionalized poly(arylene ether), and about 1 to about 80 wt %, specifically 11 to about 70 wt %, more specifically about 20 to about 70 wt %, still more specifically about 40 to about 60 wt % of the polybutadiene or polyisoprene polymer, preferably the carboxy-functionalized polybutadiene or polyisoprene polymer comprising butadiene, isoprene, or butadiene and isoprene, and less than 50 wt % of a co-curable monomer, each of the foregoing amounts being based on the total weight of the polymer matrix material. In still another embodiment, the polymer matrix material comprises about 20 to about 98 wt %, specifically about 25 to about 75 wt %, more specifically about 30 to about 50 wt % of the poly(arylene ether), preferably the carboxy-functionalized poly(arylene ether); about 1 to about 79 wt %, specifically about 10 to about 60 wt %, more specifically about 20 to about 40 wt % of the co-curable polybutadiene or polyisoprene polymer, preferably the co-curable carboxy-functionalized polybutadiene or polyisoprene polymer comprising butadiene, isoprene, or butadiene and isoprene, and less than 50 wt % of a co-curable monomer; and about 1 to about 79 wt %, specifically about 10 to about 60 wt %, more specifically about 20 to about 40 wt % of the elastomeric block copolymer, each based on the total weight of the polymer matrix material.

In addition to the polymeric matrix material, the dielectric composite material can optionally further include woven, thermally stable webs of a suitable fiber, specifically glass (E, S, and D glass) or high temperature polyester fibers (e.g., KODEL from Eastman Kodak). Such thermally stable fiber reinforcement provides a circuit laminate with a means of controlling shrinkage upon cure within the plane of the laminate. In addition, the use of the woven web reinforcement renders a circuit substrate with a relatively high mechanical strength.

Examples of the woven fiberglass web are set forth in the following Table 2.

TABLE 2

| Manufacturer | Style | Thickness, in. (um) |
|---|---|---|
| Fiber Glast | 519-A | 0.0015 (38.1) |
| Clark-Schwebel | 112 | 0.0032 (81.3) |
| Clark-Schwebel | 1080 | 0.0025 (63.5) |

TABLE 2-continued

| Manufacturer | Style | Thickness, in. (um) |
| --- | --- | --- |
| Clark-Schwebel | 1674 | 0.004 |
| Burlington | 7628 | 0.0068 (172.7) |
| JPS Composite Materials | 106 | 0.0013 |
| JPS Composite Materials | 3313 | 0.0033 |
| JPS Composite Materials | 1067 | 0.0014 |
| JPS Composite Materials | 1280 | — |

The dielectric composite material can optionally include fire retardant additives, such as bromine containing flame retardants. Suitable brominated flame retardants are commercially available from, for example, Albemarle Corporation under the trade names SAYTEX BT 93W (ethylene bistetrabromophthalimide), SAYTEX 120 (tetradecabromodiphenoxybenzene), and SAYTEX 102E (decabromodiphenoxyl oxide).

The dielectric composite material can optionally include a non-bromine and non-chlorine containing flame retardant system. Examples of such systems can include, without limitation, magnesium hydroxide as a secondary flame retardant, commercially available, for example, from Albemarle Corporation under the trade name MAGNAFIN, Sakai Chemicals under the trade name MGZ-6R, and Kyowa Corporation under the tradename Kisuma 8SN. Alumina trihydrate can also be used as a secondary flame retardant filler.

Phosphorous-containing flame retardant additives such as polyphosphates, or phosphinates available from Clariant Corporation under the trade name OP-930 can also be used in the dielectric composite material. The dielectric composite material can also contain nitrogen-based flame retardant additives such as melamine cyanurate, or nitrogen and phosphorus-containing frame retardant additives such a melamine polyphosphate.

The dielectric composite material is produced by means known in the art. The particular choice of processing conditions will depend on the polymer matrix selected.

For example, where the polymer matrix is a fluoropolymer such as PTFE, the polymer matrix material is mixed with a first carrier liquid. The mixture can comprise a dispersion of polymeric particles in the first carrier liquid, a dispersion, i.e. an emulsion, of liquid droplets of the polymer or of a monomeric or oligomeric precursor of the polymer in the first carrier liquid, or a solution of the polymer in the first carrier liquid. If the polymer component is liquid, then no first carrier liquid may be necessary.

The choice of the first carrier liquid, if present, is based on the particular polymeric matrix material and the form in which the polymeric matrix material is to be introduced to the dielectric composite material. If it is desired to introduce the polymeric material as a solution, a solvent for the particular polymeric matrix material is chosen as the carrier liquid, e.g. N-methyl pyrrolidone (NMP) would be a suitable carrier liquid for a solution of a polyimide. If it is desired to introduce the polymeric matrix material as a dispersion, then a suitable carrier liquid is a liquid in which the matrix material is not soluble, e.g. water would be a suitable carrier liquid for a dispersion of PTFE particles and would be a suitable carrier liquid for an emulsion of polyamic acid or an emulsion of butadiene monomer.

The filler component can optionally be dispersed in a suitable second carrier liquid, or mixed with the first carrier liquid (or liquid polymer where no first carrier is used). The second carrier liquid can be the same liquid or can be a liquid other than the first carrier liquid that is miscible with the first carrier liquid. For example, if the first carrier liquid is water, the second carrier liquid can comprise water or an alcohol. In an exemplary embodiment, the second carrier liquid is water.

The filler dispersion can include a surfactant in an amount effective to modify the surface tension of the second carrier liquid to enable the second carrier liquid to wet the cenospheres. Exemplary surfactant compounds include ionic surfactants and nonionic surfactants. Triton X-100®, commercially available from Rohm & Haas, has been found to be an exemplary surfactant for use in aqueous filler dispersions. Generally, the filler dispersion comprises from about 10 vol. % to about 70 vol. % filler, from about 0.1 vol. % to about 10 vol. % surfactant, with the remainder comprising the second carrier liquid.

The mixture of the polymeric matrix material and first carrier liquid and the filler dispersion in the second carrier liquid are combined to form a casting mixture. In an exemplary embodiment, the casting mixture comprises from about 10 vol. % to about 60 vol. % of the combined polymeric matrix material and cenosphere filler and from about 40 vol. % to about 90 vol. % combined first and second carrier liquids. The relative amounts of the polymeric matrix material and the filler component in the casting mixture are selected to provide the desired amounts in the final composition as described below.

The viscosity of the casting mixture can be adjusted by the addition of a viscosity modifier, selected on the basis of its compatibility in a particular carrier liquid or mixture of carrier liquids, to retard separation, i.e. sedimentation or flotation, of the cenosphere filler from the dielectric composite material, and to provide a dielectric composite material having a viscosity compatible with conventional laminating equipment. Exemplary viscosity modifiers suitable for use in aqueous casting mixtures include, e.g. polyacrylic acid compounds, vegetable gums, and cellulose based compounds. Specific examples of suitable viscosity modifiers include polyacrylic acid, methyl cellulose, polyethyleneoxide, guar gum, locust bean gum, sodium carboxymethylcellulose, sodium alginate, and gum tragacanth. The viscosity of the viscosity-adjusted casting mixture can be further increased, i.e., beyond the minimum viscosity, on an application by application basis to adapt the dielectric composite material to the selected laminating technique. In an exemplary embodiment, the viscosity-adjusted casting mixture exhibits a viscosity between about 10 cp and about 100,000 cp; specifically about 100 cp and 10,000 cp. It will be appreciated by those skilled in the art that the foregoing viscosity values are room temperature values.

Alternatively, the viscosity modifier can be omitted if the viscosity of the carrier liquid is sufficient to provide a casting mixture that does not separate during the time period of interest. Specifically, in the case of extremely small particles, e.g. particles having an equivalent spherical diameter less than 0.1 micrometers, the use of a viscosity modifier may not be necessary.

A layer of the viscosity-adjusted casting mixture can be cast on a substrate by conventional methods, e.g. dip coating, reverse roll coating, knife-over-roll, knife-over-plate, and metering rod coating. Examples of carrier materials can include metallic films, polymeric films, ceramic films, and the like. Specific examples of carriers include stainless steel foil, polyimide films, polyester films, and fluoropolymer films. Alternatively, the casting mixture can be cast onto a glass web, or a glass web can be dip-coated.

The carrier liquid and processing aids, i.e., the surfactant and viscosity modifier, are removed from the cast layer, for example by evaporation and/or by thermal decomposition, to consolidate a dielectric layer of the polymeric matrix material and the cenosphere filler.

The composition of the dielectric layer corresponds to that of the combined amount of polymeric matrix material and filler component. The layer can comprise from about 5 to about 95 vol. % polymer matrix material and about 5 vol. % to about 95 vol. % filler component, specifically about 30 to about 90 vol. % polymer matrix material and about 10 to about 70 vol. % filler component, and more specifically about 35 to about 75 vol. % polymer matrix material and about 25 to about 65 vol. % filler component.

The layer of the polymeric matrix material and filler component can be further heated to modify the physical properties of the layer, e.g. to sinter a thermoplastic matrix material or to cure and/or post cure a thermosetting matrix material.

In another method, the PTFE composite dielectric material may be made by the paste extrusion and calendering process taught in U.S. Pat. No. 5,358,775.

Useful conductive layers for the formation of the circuit laminates, multi-layer circuit laminates can include, without limitation, stainless steel, copper, gold, silver, aluminum, zinc, tin, lead, transition metals, and alloys comprising at least one of the foregoing, with copper being exemplary. There are no particular limitations regarding the thickness of the conductive layer, nor are there any limitations as to the shape, size or texture of the surface of the conductive layer. Preferably however, the conductive layer comprises a thickness of about 3 micrometers to about 200 micrometers, specifically about 9 micrometers to about 180 micrometers. When two or more conductive layers are present, the thickness of the two layers can be the same or different.

In an exemplary embodiment, the conductive layer is a copper layer. Suitable conductive layers include a thin layer of a conductive metal such as a copper foil presently used in the formation of circuits, for example, electrodeposited copper foils.

The copper foil can be made either by the electrodeposition (ED) on a rotating stainless steel drum from a copper sulfate bath, or by the rolling of solid copper bars. Where ED copper foil is used, the initial roughness of the base foil is created in the foil plating process on the "bath side" (or matte side) of the foil. Additional roughness is created in a secondary plating step. Where rolled foil used, roughness is imparted to the initially smooth and shiny foil by a secondary plating step.

This mechanical roughness can result in several drawbacks. As described in detail by Brist et al. (Gary Brist, Stephen Hall, Sidney Clouser, and Tao Liang, "Non-classical conductor losses due to copper foil roughness and treatment," p. 26, Circuitree, can 2005) and Ogawa et al. (N. Ogawa, H. Onozeki, N. Moriike, T. Tanabe, T. Kumakura, "Profile-free foil for high-density packaging substrates and high-frequency applications," p. 457, Proceedings of the 2005 Electronic Components and Technology Conference, IEEE), the roughness on a conductor surface can result in a substantial increase in conductor loss at high frequencies, with a rough conductor causing up to twice the conductor loss of a smooth one. Ogawa also describes the limitations to accurate circuit fabrication, most notably the accurate etching of fine lines and spaces that are caused by conductor roughness.

The roughness of a copper foil is generally characterized by contact profilometry or optical interferometry. Most foil manufacturers measure roughness with a contact profilometer, due to their long history with such a measurement system. Most of the values cited herein were measured using a Veeco Instruments WYCO Optical Profiler, using the method of white light interferometry. Since the roughness can exist on several different scales and will consist of many peaks and valleys with varying distances from a fixed reference plane, there are many different ways to numerically characterize the surface roughness. Two frequently reported quantities are the RMS roughness value, Rq, and the peak-to-valley roughness, Rz, with both reported in dimensions of length.

Conventional ED copper foil made for the circuit industry has had treated side Rz values of 7 to 20 micrometers (um) (corresponding to Rq values of about 1.2 to 4 um) when measured by the WYCO Optical Profiler. Contact profilometers tend to yield lower values, due to the stylus deforming the copper treatment as the measurement is made. The treated side of rolled copper foil exhibits Rz values of 3.5-5.5 um (corresponding to Rq values of 0.45-0.9 um). "Reverse treated" ED foils, such as Oak-Mitsui MLS-TOC-500 can also exhibit Rq values similar to those of rolled foils. The lower profile ED foils currently exhibit Rz values of 2 to 3 um. By WYCO measurement, the shiny side of rolled foil exhibits an Rz value of about 0.7 um and a corresponding Rq of about 0.1 um.

More recently, other types of low profile electrodeposited foils have been commercially available. These include Oak Mitsui products SQ-VLP, with an Rq value measured by the WYCO of 0.7 um and MQ-VLP with a WYCO Rq value of 0.47 um.

Both rolled and ED foils specially treated for the circuit industry are available from a number of commercial manufacturers. For example, low profile copper foils are commercially available from Oak Mitsui under the trade name "TOC-500" and "TOC-500-LZ", from Nippon Denkai under the trade name "USLP", and from Furukawa under the trade name "F1WS". High profile copper foils are commercially available from Circuit Foil under the trade name "TWS." The copper conductive layer can be treated to increase surface area, treated with a stabilizer to prevent oxidation of the conductive layer (i.e., stainproofing), or treated to form a thermal barrier. Both low and high roughness copper conductive layers can be treated with zinc or zinc alloy thermal barriers, and can further optionally comprise a stain-proofing layer.

The circuit subassemblies, e.g., laminates, can be formed by means known in the art. In one embodiment, the lamination process entails placing one or more layers of the dielectric composite material between one or two sheets of coated or uncoated conductive layers (an adhesive layer can be disposed between at least one conductive layer and at least one dielectric substrate layer) to form a circuit substrate. The layered material can then be placed in a press, e.g. a vacuum press, under a pressure and temperature and for a duration of time suitable to bond the layers and form a laminate. Lamination and curing can be by a one-step process, for example using a vacuum press, or by a multiple-step process. In an exemplary one-step process, for a PTFE polymer matrix, the layered material is placed in a press, brought up to laminating pressure (e.g., about 150 to about 400 psi) and heated to laminating temperature (e.g., about 260 to about 390° C.). The laminating temperature and pressure are maintained for the desired soak time, i.e., about 20 minutes, and thereafter cooled (while still under pressure) to below about 150° C.

In an exemplary multiple-step process suitable for thermosetting materials such as polybutadiene and/or isoprene, a conventional peroxide cure step at temperatures of about 150° C. to about 200° C. is conducted, and the partially cured stack can then be subjected to a high-energy electron beam irradiation cure (E-beam cure) or a high temperature cure step under an inert atmosphere. Use of a two-stage cure can impart an unusually high degree of cross-linking to the resulting laminate. The temperature used in the second stage is typically about 250° C. to about 300° C., or the decomposition temperature of the resin. This high temperature cure can be carried out in an oven but can also be performed in a press, namely as a continuation of the initial lamination and cure step. Particular lamination temperatures and pressures will depend upon the particular adhesive composition and the substrate composition, and are readily ascertainable by one of ordinary skill in the art without undue experimentation.

In accordance with an exemplary embodiment, FIG. 1 shows an exemplary circuit subassembly, in particular a single clad laminate 110 comprising a conductive metal layer 112 disposed on and in contact with a dielectric layer 114. The dielectric substrate layer 114 comprises a polymer matrix material having a particulate filler content of about 10 to about 70 volume percent, wherein the particulate filler comprises cenospheres. An optional glass web (not shown) can be present in dielectric substrate layer 114. It is to be understood that in all of the embodiments described herein, the various layers can fully or partially cover each other, and additional conductive layers, patterned circuit layers, and dielectric layers can also be present. Optional adhesive (bond ply) layers (not shown) can also be present, and can be uncured or partially cured. Many different multi-layer circuit configurations can be formed using the above substrates.

Figure 2:
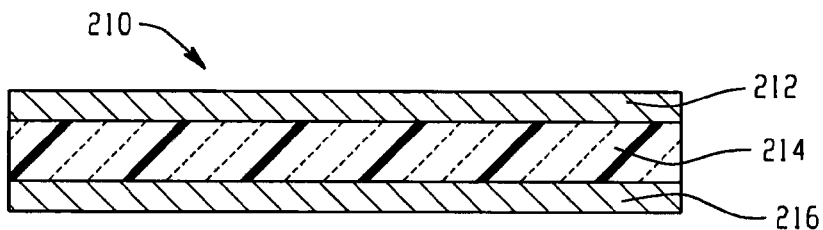
FIG. 2 is a schematic of a double clad laminate.

Another embodiment of a multilayer circuit assembly is shown at 210 in FIG. 2. Double clad circuit layer 210 comprises conductive layers 212, 216 disposed on opposite sides of a dielectric substrate layer 214 comprising cenospheres. Dielectric substrate layer 214 can comprise a woven web (not shown).

Figure 3:
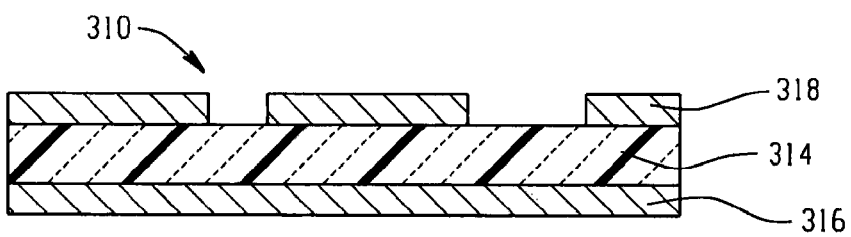
FIG. 3 is a schematic of a double clad laminate with patterned conductive layer.

A circuit subassembly 310 is shown in FIG. 3, comprising a circuit layer 318 and a conductive layer 316 disposed on opposite sides of a dielectric substrate layer 314. Dielectric substrate layer 314 can comprise a woven web (not shown).

Figure 4:
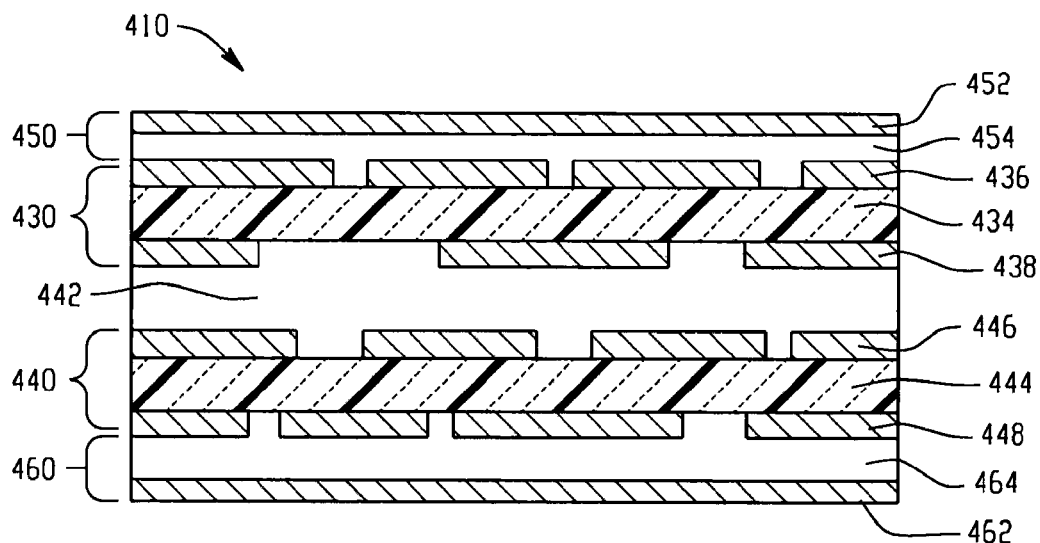
FIG. 4 is a schematic of an exemplary circuit assembly comprising two double clad circuit laminates.

FIG. 4 shows an exemplary multilayer circuit assembly 410 having a first double clad circuit 430, a second double clad circuit 440, and a bond ply 442 disposed therebetween. Double clad circuit 430 comprises a dielectric substrate 434 disposed between two conductive circuit layers 436, 438. Double clad circuit 440 comprises a dielectric substrate 444 disposed between two conductive circuit layers 446, 448. At least one, and preferably both, of dielectric substrates 434, 444 comprises cenospheres as a filler. Each dielectric substrate layer 434, 444 can comprise a nonwoven glass reinforcement (not shown). Two cap layers 450, 460 are also shown. Each cap layer 450, 460, includes a conductive layer 452, 462 disposed on a bond ply layer 454, 464.

The above-described dielectric compositions and methods provide a circuit laminate with excellent properties. In one embodiment, the circuit laminate has a dielectric constant of less than about 3.5 measured at 10 gigahertz. In another embodiment, the resultant circuit laminate has a dissipation factor of less than about 0.006 measured at 10 gigahertz. In yet another embodiment, the circuit laminate has a dielectric constant of less than about 3.5 and a dissipation factor of less than about 0.006 measured at 10 gigahertz. Specifically, the dielectric constant and dissipation factor of the circuit material are equal to or better than that of the same dielectric composite material having the more expensive conventional glass microsphere particulate filler.

The invention is further illustrated by the following non-limiting Examples.

EXAMPLES

The materials listed in Table 3 were used in the following examples.

TABLE 3

| Material name | Chemical name | Supplier |
|---|---|---|
| FILLITE ® 106 | Cenosphere filler, particles size = 5-106 um | Trelleborg Fillite |
| FILLITE ® 160W | Cenosphere filler, particles size = 5-180 um | Trelleborg Fillite |
| E-SPHERES SL-75 | Cenosphere | Envirospheres Pty. Ltd. |
| BIONIC BUBBLE ™ XL-150 ® | Cenosphere | Sphere Services, Inc. |
| VEA X-10 | Cenosphere | Sphere Services, Inc. |
| Ecosphere SID 200Z | Hollow synthetic microsphere | Trelleborg Emerson & Cuming, Inc. |
| Ecosphere SID 311Z | Hollow synthetic microsphere | Trelleborg Emerson & Cuming, Inc. |
| S60/HS | Hollow synthetic microsphere | 3M |
| DC-6124 | Phenyltrimethoxysilane | Dow Corning |
| Triton X-100 | Surfactant | Rohm & Haas |
| D1010 | Polytetrafluoroethylene | Solvay |
| Acrysol ASE-75 | Polyacrylic acid dispersion | Rohm and Haas |
| Kapton | Polyimide cast film | DuPont |
| B3000 | Polybutadiene resin | Nippon |
| Kraton D1118 | Styrene and butadiene block copolymer | Kraton Polymers |
| Trilene 65 | EPDM | Crompton |
| CE-44i | Silica | CE Minerals |

Examples 1-6

Cenosphere-filled PTFE substrates were made using the methods described above, using the Fillite® 106, Fillite® 160W, and E-SPHERES L-75 cenospheres at filler contents of 57 to 67 vol. % on a dry solids basis.

To make the targeted 60 volume % SL-75 Cenosphere-filled dielectric composition, 80 grams of the SL-75 cenospheres, 4 grams of Dow Corning DC-6124 phenyltrimethoxysilane, and 5 grams of Triton X-100 surfactant were added to 322 grams of Solvay D1010 60% solids PTFE dispersion and mixed well. Three grams of Rohm and Haas Acrysol ASE-75 dispersion was added to increase the viscosity of the mix, after adding 1 gram of ammonium hydroxide. The liquid mix was cast on 0.003 inches (0.08 mm) DuPont Kapton polyimide carrier layer and air-dried. The dried mix-coated polyimide sheets were placed in a 700° F. (371° C.) oven for 5 minutes to sinter the PTFE. The PTFE composite sheet was removed from the polyimide carrier. 4 to 5 sheets were stacked to make a laminate with a final thickness of about 0.020 inch (0.51 mm). The composite PTFE was placed between copper foil sheets and laminated in a flat bed press at a temperature of 700° C. (371° C.) for 30 minutes. The laminates were removed from the press after cooling to room temperature and the copper foil was fully etched to form the circuit substrates.

Laminates containing the other cenospheres were similarly produced.

The dielectric constant (K') and dissipation factor (DF) of each laminate were measured at 10 gigahertz (GHz) using the clamped stripline test method described in IPC-TM-650

2.5.5.5.1. The data in Table 4 below shows that use of cenosphere fillers having lower iron oxide content lead to a better (lower) dissipation factor.

TABLE 4

| Example | Filler | Loading (vol. %) | K' | Df | Iron Oxide wt. % |
|---|---|---|---|---|---|
| 1 | FILLITE ® 106 | 60 | 2.08 | 0.0072 | 5 |
| 2 | FILLITE ® 106 | 67 | 2.07 | 0.0076 | 5 |
| 3 | FILLITE ® 160W | 57 | 2.02 | 0.0037 | 2 |
| 4 | SL-75 | 57 | 1.89 | 0.0019 | 0.5 |
| 5 | SL-75 | 62 | 1.90 | 0.0023 | 0.5 |
| 6 | SL-75 | 67 | 1.85 | 0.0025 | 0.5 |

As can be seen in Examples 3-6, the circuit laminates wherein the dielectric substrates comprise a cenosphere filler with low ferric oxide content (less than 5 wt. %) have a K' of less than or equal to about 2 and a Df of less than about 0.004.

Examples 7-9

Rogers RO4003C high frequency circuit substrates exhibit a dielectric constant of about 3.4 when tested at 10 GHz in accordance with the IPC-TM-650 2.5.5.5c test method. In order to demonstrate that a lower dielectric constant material could be made, a portion of the fused amorphous silica filler present in the RO4003C was replaced with cenosphere filler. Three different cenosphere materials were tested: SL-75, XL-150, and VEA X-10.

Table 5 lists the dielectric composite material components used for each of the three different cenosphere compositions. The solids were dissolved in xylene at a consistency of about 25 wt. % and coated onto 1080 style woven glass fabric to a dry solids basis weight of about 210 grams per square meter. 4 to 5 plies were stacked to form approximately 0.020 inch (0.51 mm) thick laminates and were laminated to copper foil in a flat bed press for a duration of 1 hour at a temperature of 575° F. (302° C.) and pressure of 1000 pounds per square inch (6.89 MPa) to form the laminates.

TABLE 5

| Component | grams |
|---|---|
| Kraton D1118 | 103.2 |
| Trilene 65 | 10.1 |
| B3000 resin | 89.3 |
| CE-44i silica | 595.0 |
| Cenosphere | 115.0 |
| Perkadox 30 | 8.0 |
| Antioxidant | 3.4 |

The laminated sheets were removed from the press and the copper foil was fully etched to form circuit subassemblies. The dielectric constant and dissipation factor were tested at 10 GHz using the clamped stripline test method described in IPC-TM-650 2.5.5.5.1.

As shown in Table 6, the measured dissipation factor correlates directly with the iron oxide content of the cenospheres. It is clear from these examples that high frequency, low dielectric constant, and low loss composite circuit substrates can be made using cenosphere filler with an iron oxide content of about 3 wt. % or less. Each of the Examples 7-9 produced a composite circuit substrate having a dielectric constant of less than about 3.2 and a dissipation factor of less than or equal to about 0.006, specifically 0.005 or less.

TABLE 6

| Example | Cenosphere type | DK | DF | $Fe_2O_3$ (wt. %) |
|---|---|---|---|---|
| 7 | SL-75 | 3.07 | 0.003 | 0.5% |
| 8 | X-10 | 3.19 | 0.004 | 1.3% |
| 9 | XL-150 | 3.15 | 0.005 | 3.0% |

Comparative Examples A-D

PTFE composites similar to the cenosphere compositions described above were made with the more expensive prior art synthetic hollow microsphere fillers to compare the dielectric constant and dissipation factors with the previous examples.

Four PTFE composites containing 57 volume % of four different types of synthetic hollow microspheres were made by the method described in Examples 1-6. The synthetic materials included three types of hollow microspheres made by Trellebourg Emerson & Cuming, Inc. An additional PTFE composite was made with 3M S60/HS synthetic microspheres Details of the four formulations and the measured DK and KF are shown in Tables 7 and 8. The amount of each component is given in grams

TABLE 7

| | Comparative Examples | | | |
|---|---|---|---|---|
| Component | A | B | C | D |
| D1010 PTFE disp. | 306 | 273 | 306 | 273 |
| SI-130 μ-spheres | 14 | — | — | — |
| SID-200Z μ-spheres | — | 20 | — | — |
| SID-311Z μ-spheres | — | — | 35 | — |
| S60/HS μ-spheres | — | — | — | 65 |
| DC6124 silane | 0.4 | 0.4 | 0.4 | 0.4 |
| Acrysol ASE-75 | 0.2 | 0.2 | 0.2 | 0.2 |
| Triton X-100 | 0.5 | 0.5 | 0.5 | 0.5 |
| Ammonium hydroxide | 0.1 | 0.1 | 0.1 | 0.1 |

As can be seen from Table 8, the dissipation factors of the Comparative Examples are quite similar to the cenosphere-filled PTFE composites. Therefore, high frequency composite circuit substrates having low dielectric constants and low loss can be made using less expensive particulate filler without sacrificing the desired electrical properties.

TABLE 8

Dielectric Constant and Dissipation Factor at 10 GHz of synthetic glass microsphere filled PTFE substrates

| Formulation | DK | DF |
|---|---|---|
| A | 1.59 | 0.0020 |
| B | 1.64 | 0.0019 |
| C | 1.97 | 0.0017 |
| D | 1.95 | 0.0030 |

Ranges disclosed herein are inclusive of the recited endpoint and are independently combinable. "Combination" is inclusive of blends, mixtures, alloys, reaction products, and the like. Also, "combinations comprising at least one of the foregoing" means that the list is inclusive of each element individually, as well as combinations of two or more elements of the list, and combinations of one or more elements of the list with non-list elements. The terms "first," "second," and so forth, herein do not denote any order, quantity, or importance, but rather are used to distinguish one element from another.

The terms "a" and "an" herein do not denote a limitation of quantity, but rather denote the presence of at least one of the referenced item. The modifier "about" used in connection with a quantity is inclusive of the state value and has the meaning dictated by context, (e.g., includes the degree of error associated with measurement of the particular quantity). In addition, it is to be understood that the described elements can be combined in any suitable manner in the various embodiments.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

While the invention has been described with reference to several embodiments thereof, it will be understood by those skilled in the art that various changes can be made and equivalents can be substituted for elements thereof without departing from the scope of the invention. In addition, many modifications can be made to adapt a particular situation or material to the teachings of the invention without departing from the essential scope thereof. Therefore, it is intended that the invention not be limited to the particular embodiments disclosed as the best mode contemplated for carrying out this invention, but that the invention will include all embodiments falling within the scope of the appended claims.

What is claimed is:

1. A circuit subassembly, comprising
a conductive layer disposed on a dielectric substrate layer, wherein the dielectric layer comprises, based on the volume of the dielectric layer,
about 30 to about 90 volume percent of a polymer matrix material, and
about 10 to about 70 volume percent of a filler component comprising a plurality of cenospheres having a ferric oxide content of about 3 weight percent or less based on the weight of the cenospheres;
wherein the circuit laminate has a dielectric constant of less than about 3.5 and a dissipation factor of less than about 0.006.

2. The circuit subassembly of claim 1, wherein the cenospheres have a median particle diameter of 20 to 100 micrometers.

3. The circuit subassembly of claim 1, wherein the filler component comprises 1 to 100 volume percent of the cenospheres, based on the total volume of the filler component.

4. The circuit subassembly of claim 1, wherein the filler component comprises an additional filler, in an amount from 20 to 80 vol. %, based on the total volume of the filler component.

5. The circuit subassembly of claim 4, wherein the additional filler is silica, fused amorphous silica, or a combination thereof.

6. The circuit subassembly of claim 4, wherein the additional filler is alumina trihydrate, magnesium hydroxide, or a combination thereof.

7. The circuit subassembly of claim 1, wherein the polymer matrix material comprises 1,2-polybutadiene, polyisoprene, polyetherimide, fluoropolymer, polyphenylene ether, polyimide, polyetheretherketone, polyamidimide, polyethylene terephthalate, polyethylene naphthalate, polycyclohexylene terephthalate, or combinations thereof.

8. The circuit subassembly of claim 1, wherein the polymer matrix material is polytetrafluoroethylene.

9. The circuit subassembly of claim 1, wherein the polymer matrix material is 1,2-polybutadiene, polyisoprene, or a combination of 1,2-polybutadiene and polyisoprene.

10. The circuit subassembly of claim 1, wherein the polymer matrix material comprises a poly(arylene ether).

11. The circuit subassembly of claim 10, wherein the poly(arylene ether) is carboxy-functionalized.

12. The circuit subassembly of claim 10, further comprising a polybutadiene or polyisoprene polymer.

13. The circuit subassembly of claim 12, wherein the polybutadiene or polyisoprene polymer is carboxy-functionalized, and comprises butadiene, isoprene, or butadiene and isoprene, and less than 50 weight percent of a co-curable monomer.

14. The circuit subassembly of claim 1, further comprising a second conductive layer disposed on a side of the dielectric substrate layer opposite the conductive layer.

15. The circuit subassembly of claim 1, wherein the conductive layer is a copper foil.

16. The circuit subassembly of claim 1, wherein the conductive layer is etched to provide a circuit.

17. The circuit subassembly of claim 1, wherein the conductive layer is in contact with the dielectric layer.

18. The circuit subassembly of claim 1, wherein a bond ply is disposed between and in contact with the conductive layer and the dielectric substrate layer.

19. A circuit comprising the circuit subassembly of claim 1.

20. A multi-layer circuit comprising circuit subassembly of claim 1.

21. A method of making a circuit subassembly, the method comprising:
combining a polymer matrix material and a filler component to form a dielectric composite material;
forming a layer of the dielectric composite material, wherein the dielectric composite material comprises about 30 to about 90 volume percent of a polymer matrix material, and about 10 to about 70 volume percent of a filler component comprising a plurality of cenospheres having a ferric oxide content of about 3 weight percent or less based on the weight of the cenospheres;
disposing a conductive layer on the dielectric composite layer; and
laminating the dielectric composite layer and the conductive layer to form a circuit subassembly having a dielectric constant of less than about 3.5 and a dissipation factor of less than about 0.006.

22. The method of claim 21, wherein the cenospheres have a median particle diameter of 20 to 100 micrometers.

23. The method of claim 21, wherein the filler component comprises an additional filler, in an amount from 20 to 80 vol. %, based on the total volume of the filler component, wherein the additional filler is silica, fused amorphous silica, alumina trihydrate, magnesium hydroxide, or a combination thereof.

24. A circuit subassembly made by the method of claim 21.

* * * * *